United States Patent
Matsudome

(10) Patent No.: US 6,502,740 B2
(45) Date of Patent: Jan. 7, 2003

(54) SOLDERING METHOD

(75) Inventor: Takatsugu Matsudome, Kanagawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/803,902

(22) Filed: Mar. 13, 2001

(65) Prior Publication Data

US 2001/0022316 A1 Sep. 20, 2001

(30) Foreign Application Priority Data

Mar. 17, 2000 (JP) .......................................... 2000-075921

(51) Int. Cl.$^7$ .......................... B23K 31/02; B23K 31/00
(52) U.S. Cl. .............................. 228/180.1; 228/248.1; 228/256; 29/840; 427/96
(58) Field of Search ........................... 228/248.1, 180.1, 228/256, 219, 260, 262, 33, 37; 427/96; 29/840

(56) References Cited

U.S. PATENT DOCUMENTS

| | | | | |
|---|---|---|---|---|
| 3,893,409 A | * | 7/1975 | Rote ............................ | 118/56 |
| 4,334,646 A | * | 6/1982 | Campbell .................. | 174/94 R |
| 4,515,304 A | * | 5/1985 | Berger ........................ | 228/136 |
| 4,518,114 A | * | 5/1985 | Walsh ...................... | 228/180.1 |
| 4,591,088 A | * | 5/1986 | Mulliner et al. ............ | 228/121 |
| 4,661,887 A | * | 4/1987 | Lin ........................... | 174/94 R |
| 4,874,124 A | * | 10/1989 | Johns et al. .............. | 228/180.1 |
| 5,044,542 A | * | 9/1991 | Deambrosio ................ | 118/421 |
| 5,176,312 A | * | 1/1993 | Lowenthal ................ | 228/180.1 |
| 5,477,419 A | * | 12/1995 | Goodman et al. .......... | 174/263 |
| 5,542,596 A | * | 8/1996 | Cimbak .................... | 228/234.2 |
| 6,070,788 A | * | 6/2000 | Zakel .......................... | 228/214 |
| 6,315,189 B1 | * | 11/2001 | Williams .................. | 228/180.1 |

FOREIGN PATENT DOCUMENTS

JP 04-44391 A * 2/1992

* cited by examiner

*Primary Examiner*—Tom Dunn
*Assistant Examiner*—L. Edmondson
(74) *Attorney, Agent, or Firm*—Whitham, Curtis & Christofferson, PC

(57) ABSTRACT

In order to solder a lead wire of an electronic device to a wiring pattern formed on a printed circuit board, the electronic device is first placed on a first face of the printed circuit board such that the lead wire thereof are protruded from a second face of the printed circuit board, on which the wiring pattern is formed. Then cream solder is coated on the protruded lead wire. On the other hand, there is provided a liquefied heat medium having a temperature higher than a melting temperature of the cream solder. The second face of the printed board is immersed in the liquefied heat medium in a predetermined time period, to melt the cream solder. Finally, the printed board is lifted from the liquefied heat medium.

2 Claims, 3 Drawing Sheets

SOLDERING METHOD

BACKGROUND OF THE INVENTION

The present invention relates to a soldering method for soldering lead wires on wiring patterns of a printed circuit board after inserting the lead wires of an electronic device that protrudes downward via through holes of the printed circuit board having the wiring patterns provided on the rear side thereof.

A so-called dip process as shown in FIGS. 4 and 5, has been employed as such a soldering method, for example.

In the process, lead wires 1a of an electronic device 1, which protrude downward, is first inserted into through holes 2b of a printed circuit board 2 on which wiring patterns 2a are provided, and are immersed in a soldering tank 3 in which solder is heated and melted at above the melting temperature, and lifted up therefrom, wherein solder provided in the soldering tank 3 is adhered to the lead wires 1a and is hardened in a required time, and the lead wires la are soldered to the wiring patterns 2a of the printed circuit board 2, thereby forming soldered parts 4.

Also, although not illustrated, a so-called reflow process has been employed, in which cream soldering is coated in advance on the soldering portion on the wiring patterns on the rear side, after the lead wires are inserted through the through holes of a printed circuit board, and hot air is partially applied to the soldering portion on which the cream solder is provided, or causing the printed circuit board to pass through a high temperature room whose temperature is higher than the melting temperature of the cream solder, whereby the cream solder is melted, thereby performing soldering.

However, such a process has various types of problems as described below:

That is, in the case of the dip process, as lead wires are immersed in the soldering tank 3 and lifted up therefrom, the solder is raised along the lead wires, and at the same time the solder is spread on the wiring patterns 2a and 2a secured on the rear side of a printed circuit board 2 by the surface tension, wherein the adjacent wiring patterns 2a are brought into contact with each other, wherein there is probability that an electric short-circuit may occur.

Also, in order to prevent such a situation from occurring, the amount of adhered solder 4 becomes short, wherein there is another problem in that the electrical properties may be worsened.

Taking the above problems into consideration, it was very difficult to control and adjust the soldering work in satisfactory conditions.

In the case of the reflow process, lead wires are inserted into through holes of a printed circuit board and cream solder is coated in advance onto soldering portions on the wiring patterns on the rear side thereof, wherein hot air is directly applied thereto to melt the solder for soldering. However, since hot air is blown thereon, the solder may be oxidized, thereby worsening the characteristics of the solder. Also, where hot air is directly blown thereon, the temperature of the printed circuit board is raised before the cream solder reaches its melting temperature, electronic devices secured on the printed circuit board are accordingly heated, whereby the characteristics of the electronic devices may be worsened.

Further, in the case of a process of passing a printed circuit board through a high temperature room whose temperature is retained at the melting temperature of the solder or above the characteristics of other electronic devices mounted on the printed circuit board other than those to be soldered are worsened, and electronic devices that are adversely affected by heat cannot be mounted.

SUMMARY OF THE INVENTION

The present invention was developed in view of the above-described problems and shortcomings. It is therefore an object of the invention to provide a soldering method, by which desired electrical characteristics can be secured, no soldering defect is brought about due to oxidization, the influence on electronic devices mounted on the surface of a printed circuit board can be suppressed, and resultantly electronic devices that are not resistant against heat may be mounted.

In order to achieve the above object, according to the invention, there is provided a method of soldering a lead wire of an electronic device to a wiring pattern formed on a printed circuit board, comprising the steps of:

placing the electronic device on a first face of the printed circuit board such that the lead wire thereof are protruded from a second face of the printed circuit board, on which the wiring pattern is formed;

coating cream solder on the protruded lead wire;

providing a liquefied heat medium having a temperature higher than a melting temperature of the cream solder;

immersing the second face of the printed board in the liquefied heat medium in a predetermined time period, to melt the cream solder; and lifting the printed board from the liquefied heat medium.

According to the above method, after the lifting the printed board, the melted cream solder coated on the lead wires is hardened to solder the lead wires. Therefore, satisfactory soldering can be obtained.

In this method, since an own weight of the melted cream solder is counterbalanced by a diffusion force resulting from a surface tension on the wiring pattern, the undesired contact of the adjacent wiring patterns due to the diffusion of the melted solder as in the dip process will not occur.

Further, since the heat medium to melt the solder is liquefied, no oxidization is allowed to occur, wherein it is possible to prevent the characteristics of the solder from worsening in comparison with the reflow process.

Still further, since the influence of heat can be minimized at not only the electronic devices to be soldered but also other electronic devices mounted in the printed circuit board. In particular, electronic devices that are likely to be affected by heat can be mounted. Accordingly, it will become possible to incorporate remarkably multi-purposed electronic devices.

DETAILED DESCRIPTION OF THE PREFERRED EMBODIMENTS

Hereinafter, a detailed description is given of the invention based on an embodiment with reference to the accompanying drawings.

Figure 1:
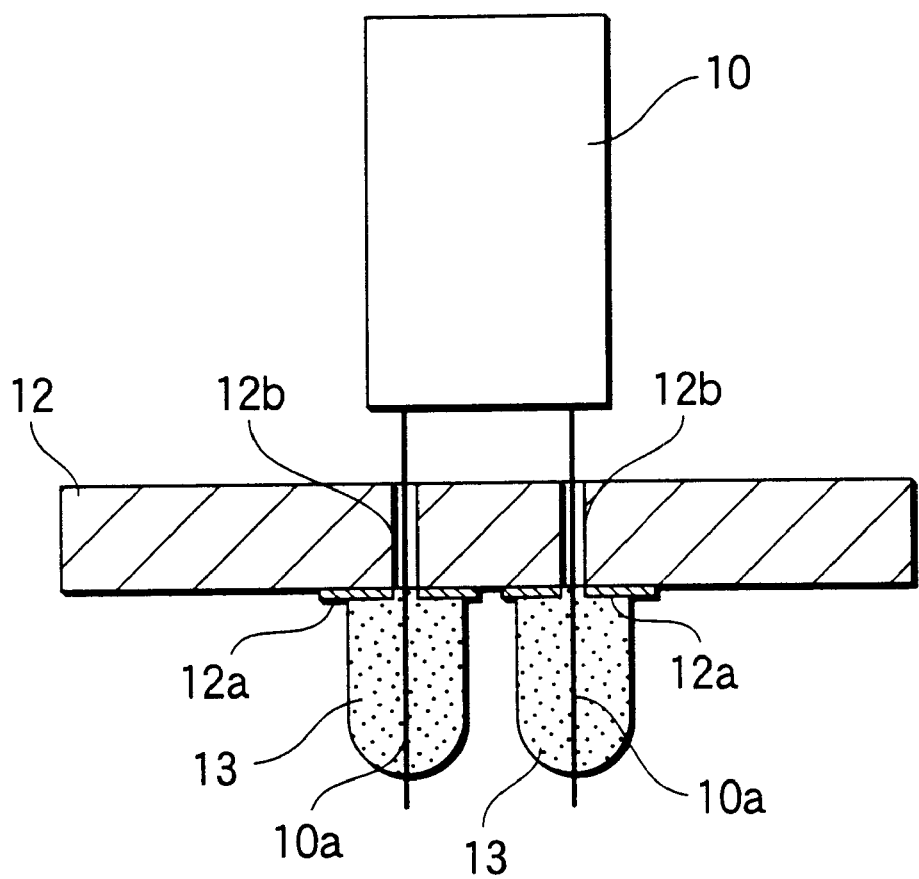
FIG. 1 is a sectional view explaining the first step of a soldering method according to the invention.
Figure 2:
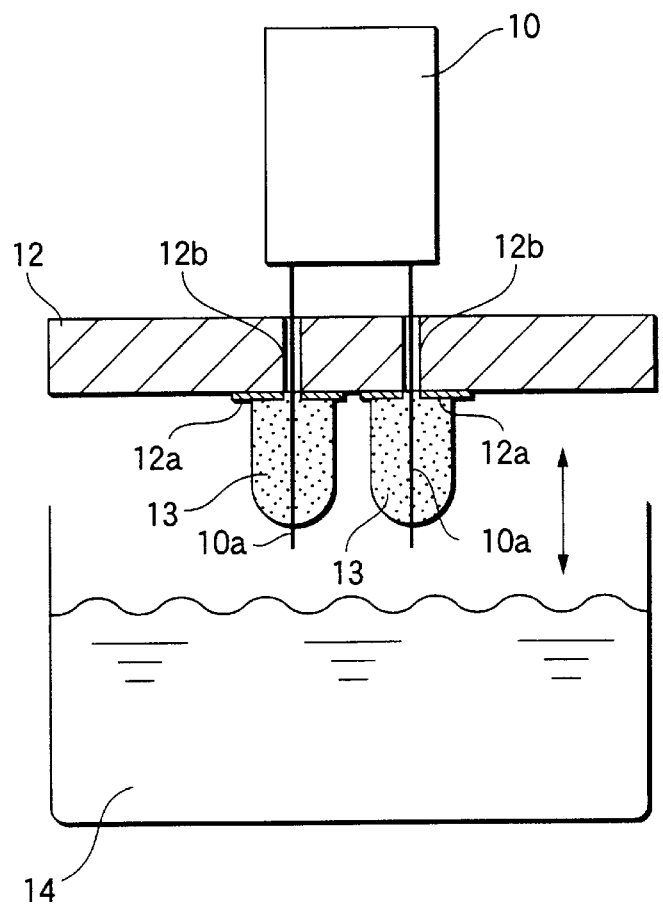
FIG. 2 is a sectional view explaining the second step of a soldering method according to the invention.
Figure 3:
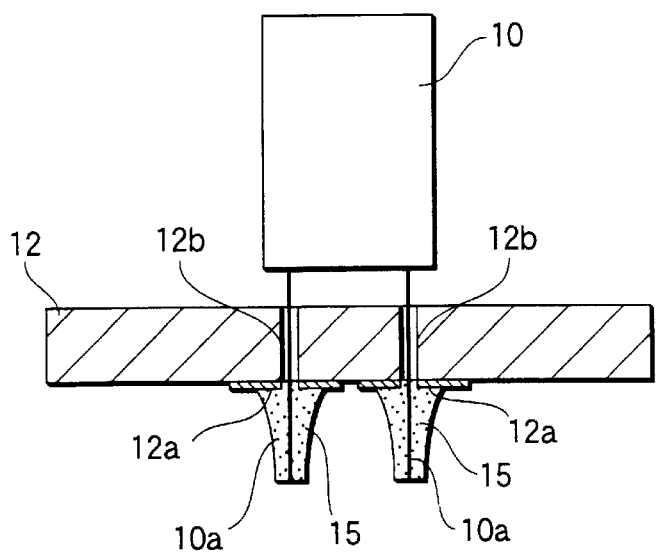
FIG. 3 is a sectional view showing a state obtained by the soldering method according to the invention.
Figure 4:
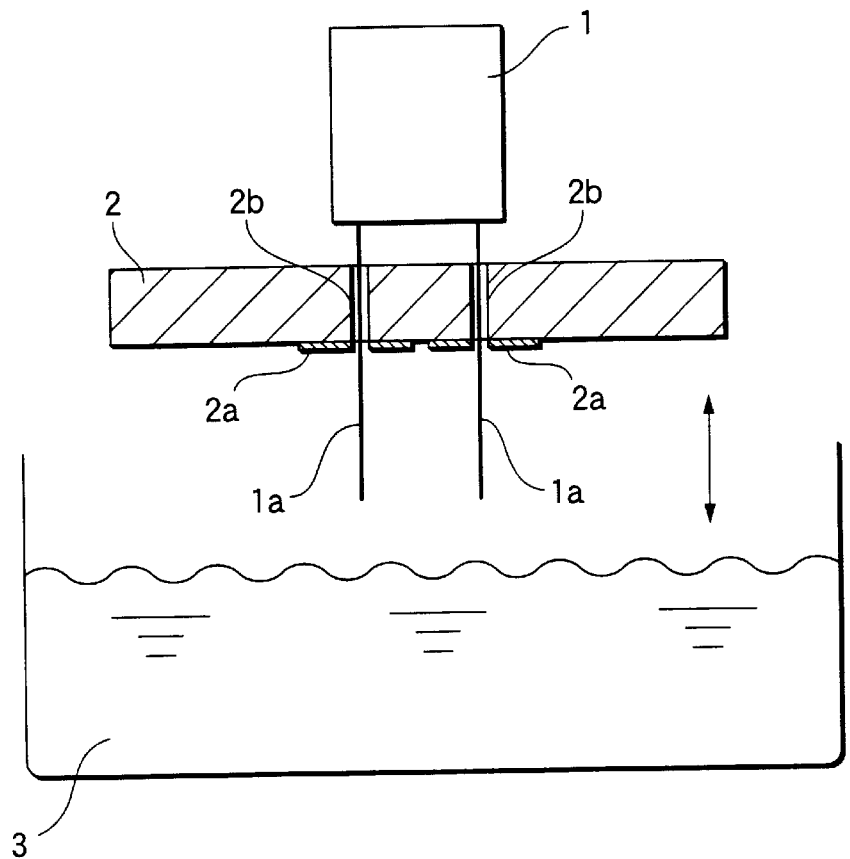
FIG. 4 is a sectional view explaining a related soldering method.
Figure 5:
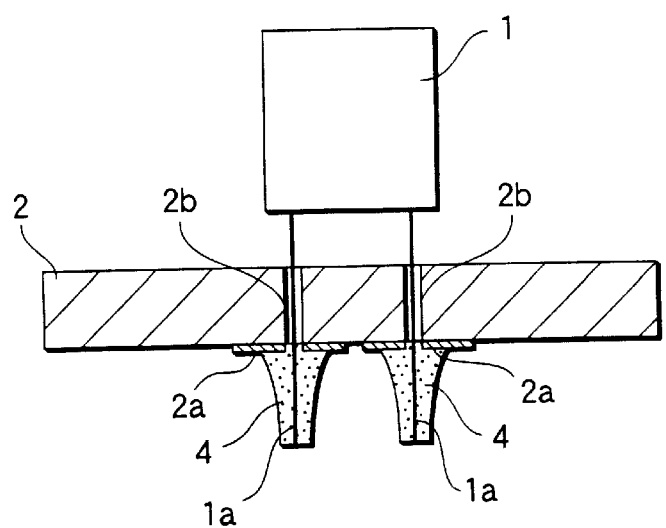
FIG. 5 is a sectional view showing a state obtained by the related soldering method.

FIGS. 1 through 3 are provided to describe a preferred embodiment of a soldering method according to the invention. First, as the first step, lead wires 10a of an electronic device 10 that protrude downward via through holes 12b of a printed circuit board 12 having wiring patterns 12a provided on the rear side thereof, and cream solder 13 is coated on the lead wires 10a protruding downward.

As the next step from this state, the cream solder 13 is immersed in a liquefied heat medium tank 14 that is heated above the melting temperature, and is lifted up therefrom after that, whereby soldering is carried out on the wiring patterns 12a of the printed circuit board 12.

In this embodiment, the own weight of the melted cream solder 13, is counterbalanced by a diffusion force resulting from the surface tension on the wiring patterns 12a provided on the rear side of the printed circuit board 12, and satisfactory soldering 15 can be obtained on the wiring patterns 12a as shown in FIG. 3. Resultantly, the undesired contact of the adjacent wiring patterns 12a due to the diffusion of the melted solder and undesired electric short-circuit will not be allowed to occur.

According to the results of repeated experiments, satisfactory soldering results could be obtained, and the above-described embodiment could be confirmed.

Further, since the heat medium to melt the solder is a heated and melted liquid, no oxidization is allowed to occur, and it is possible to prevent the characteristics of soldering from worsening.

Still further, since the cream solder 13 coated in advance is immersed in a heated liquefied heat medium tank 14 and is lifted up therefrom after a required period of time elapses, the heat transfer to electronic devices 10. incorporated on a printed circuit board 12 is suppressed. In particular, electronic devices that are likely to be affected by heat can be mounted, and it will become possible to incorporate remarkably multi-purposed electronic devices.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A method of soldering a lead wire of an electronic device to a wiring pattern formed on a printed circuit board, comprising the steps of:

placing the electronic device on a first face of the printed circuit board such that the lead wire thereof are protruded from a second face of the printed circuit board, on which the wiring pattern is formed;

coating cream solder on the protruded lead wire;

providing a liquefied heat medium having a temperature higher than a melting temperature of the cream solder;

immersing the second face of the printed board in the liquefied heat medium in a predetermined time period, to melt the cream solder; and lifting the printed board from the liquefied heat medium.

2. The soldering method as set forth in claim 1, wherein the amount of the coated cream soldering is determined such that an own weight of the melted cream solder is counterbalanced by a diffusion force resulting from a surface tension on the wiring pattern.

* * * * *